United States Patent [19]

Gross et al.

[11] Patent Number: 5,376,794
[45] Date of Patent: Dec. 27, 1994

[54] SENSOR ASSEMBLY WITH COOLED SENSOR

[75] Inventors: Michael Gross, Überlingen; Bernd Uwira, Konstanz, both of Germany

[73] Assignee: Bodenseewerk Gerätetechnik GmbH, Überlingen, Germany

[21] Appl. No.: 170,939

[22] Filed: Dec. 21, 1993

[30] Foreign Application Priority Data

Dec. 30, 1992 [DE] Germany .............................. 4244480

[51] Int. Cl.$^5$ .............................................. G01J 5/06
[52] U.S. Cl. .................................................... 250/352
[58] Field of Search ......................................... 250/352

[56] References Cited

U.S. PATENT DOCUMENTS 4,005,288 1/1977 Robillard ............................ 250/352

FOREIGN PATENT DOCUMENTS 2247845 4/1973 Germany .
2730945 4/1978 Germany .
52-60982 5/1977 Japan .

Primary Examiner—Carolyn E. Fields
Attorney, Agent, or Firm—Keck, Mahin & Cate

[57] ABSTRACT

In a sensor assembly, a cooled sensor is arranged in the vacuum chamber of a Dewar vessel. The Dewar vessel has an inner housing element and an outer housing element. Both housing elements are made of metal and are pot-shaped. The outer housing element extends around the inner housing element. The two housing elements define the vacuum chamber of the Dewar vessel. The inner housing element carries the sensor on its end face within the vacuum chamber. A cooler is arranged in the cavity formed by the inner housing element. A tubular support body made of multi-layer glass-ceramic material is arranged in the vacuum chamber and surrounds the inner housing element. The support body supports the inner housing element through radial projections and contains conductors for connecting the sensor.

10 Claims, 5 Drawing Sheets

SENSOR ASSEMBLY WITH COOLED SENSOR

The invention relates to a sensor assembly having a cooled sensor. Such sensors are, in particular, infrared-sensitive sensors for seekers which track an infrared emitting target. Such seekers are used in seeker heads of target-tracking missiles.

In order to increase the sensitivity of the sensor and to reduce noise, such sensors are cooled by a cooler. To this end a Dewar vessel is provided. This Dewar vessel contains a pot-shaped inner housing element and an also pot-shaped outer housing element. The outer housing element extends around the inner housing element. The housing elements are interconnected to define a vacuum chamber. Thereby heat transfer between the housing elements is reduced. A cooler is located in an inner cavity defined by the pot-shaped inner housing element. Usually, the cooler is a Joule-Thomson-cooler. A sensor to be cooled is mounted within the vacuum chamber on the "bottom" of the pot-shaped inner housing element. The "bottom" of the outer housing element contains a window transparent to infrared radiation. The sensor may be a single, infrared-sensitive detector element. The detector may, however, also be a one-or two-dimensional array of such detector elements.

Quite often, such sensor assemblies have to be accommodated within very small available space. The specified performance data of the sensors must not be affected by electromagnetic interferences. They have to exhibit electromagnetic compatibility. Furthermore, the cooling power expenditure is to be kept low. This is true both for the size and for the weight and for the power and coolant consumption of the cooler. The cooling-down time should be short to permit the sensor to be used immediately after it has been activated.

The sensor is to endure high accelerations, at least over a short time, without damage. In the case of vibrations, undesired signal modulation due to resonant oscillations of the sensor mounting can occur. Therefore, the natural frequencies ought to be as high as possible. Measures to increase the resonant frequencies, however, must not adversely affect the thermal economy of the sensor.

Furthermore, in certain cases, the specification requires that the sensor assembly is to have a long useful life of up to twenty years.

It is known to make the inner housing element of glass. The electrical conductors for connection of the sensor are arranged along the peripheral surface of the inner housing element. In a prior art sensor assembly (German patent 2,247,845) the conductors are embedded in the wall of the inner, tubular element. Such conductors are metallic and, therefore, are good heat conductors. In order to avoid heat dissipation, the inner housing element with the conductors has to be correspondingly long. The conductors have to be as thin as possible. Very thin conductors, however, adversely affect the signal transmission. Long housing elements contradict the requirement to accommodate the sensor assemblies within small space With some sensors, in particular picture sensors, many conductors are required. Sometimes, high-frequency signals are transmitted through these conductors. If many such conductors are accommodated side-by-side on the peripheral surface of the inner housing element, the problem of cross-talk will arise. Measures of the prior art for shielding these conductors from each other are unsatisfactory. For example, grounded conductors are interposed between adjacent signal lines. This reduces the number of the signal lines which can be provided. This is inadmissible with complex sensors such as picture sensors.

If the inner housing element is supported on the more rigid outer housing element (as, for example, in Japanese patent 52-60982), an undesirably high heat flux from the warm outer housing element to the cold inner housing element and the sensor will be caused by the support.

The prior art sensor assemblies present also problems with respect to the shielding from electromagnetic interferences.

A prior art Dewar vessel has inner and outer housing elements of glass, which are surrounded by an outer tube of metal (German patent application 2,730,945). The conductors extend along a peripheral surface of the inner housing element. Such an arrangement suffers also from the disadvantages of the prior art assemblies with respect to rigidity and cross-talk. With a given volume available for the whole assembly, the volume of the vacuum chamber is reduced. With a technically determined leakage rate, this will reduce the useful life of the sensor assembly to about one third.

It is the object of the invention, to design a sensor assembly with cooled sensor such that it will have small dimensions and good thermal characteristics, has a long useful life and is insensitive to outside interferences.

In the sensor assembly of the invention, the sensor is arranged in the vacuum chamber of a Dewar vessel. The Dewar vessel has an inner housing element and an outer housing element. The housing elements are pot-shaped, the outer housing element extending around the inner housing element. The two housing elements limit the vacuum chamber of the Dewar vessel. The inner housing element carries the sensor on its end face inside the vacuum chamber. The inner housing element, in an inner cavity defined therein, encloses a cooler.

According to the invention a tubular support body is arranged in the vacuum chamber of the Dewar vessel. The support body is held by a socket at the end remote from the sensor and surrounds the inner housing element. The support body consists of a plurality of coaxial tubular layers. The conductors for the connection of the sensor are provided on peripheral surfaces of the support body.

The sensor assembly of the invention comprises an additional support body arranged within the vacuum chamber. This support body supports the inner housing element. Thereby, the supporting members do not extend up to the warm outer housing element. The support body is a multi-layer body and contains the conductors for connecting the sensor. This permits a rather large number of conductors to be provided. These conductors can be shielded from each other in the various layers, whereby no cross-talk can occur. Individual layers can be provided as shields.

In a preferred embodiment, the inner and outer housing elements consist of metal. The support body consists of ceramic material, namely of multi-layer glass-ceramic material. Signal processing electronic circuits for processing sensor signals are mounted within the vacuum chamber on the support body. The signal processing electronic circuits contain means for reducing the number of the lines to be led out of the vacuum chamber.

The Dewar vessel has a flange-like socket with a first socket element, which is provided at the outer housing element, a second socket element, which is provided at the inner housing element and an annular printed circuit board, which is sealingly clamped between the first and second socket elements and limits the vacuum chamber. The printed circuit board is a multi-layer printed circuit board. In order to lead the different lines out of the vacuum chamber, the printed circuit board has strip conductors on its various layers. These strip conductors are interconnected by feed-through elements. The printed circuit board carries, inside and outside of the vacuum chamber, components of the electronic circuitry of the sensor.

An embodiment of the invention is described in greater detail hereinbelow with reference to the accompanying drawings.

Figure 1:
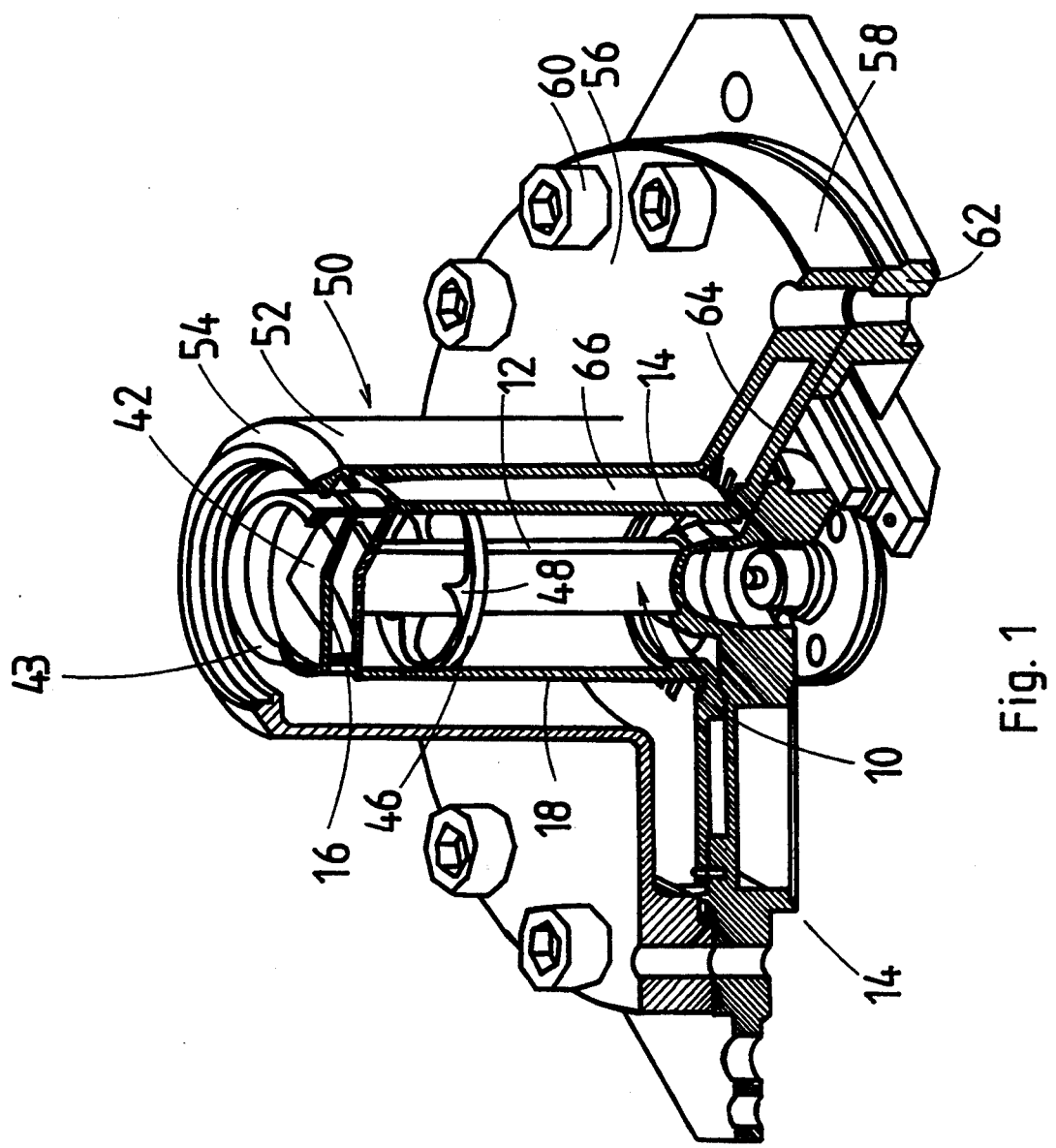
FIG. 1 is a perspective view, partly in section, of a sensor assembly having a cooled sensor.

The sensor assembly has an inner housing element 10. The inner housing element 10 comprises a tube 12 of metal. At its lower end, as viewed in FIG. 1, the tube 12 is held in a socket 14. At its upper end, as viewed in FIG. 1, the tube 12 is sealingly closed by a plate 16. The plate forms the "bottom" of the pot-shaped, inner housing element. The plate 16, however, extends laterally beyond the tube 12. A cooling device 17 in the form of a Joule-Thomson cooler is arranged in the interior of the tube 12.

Figure 2:
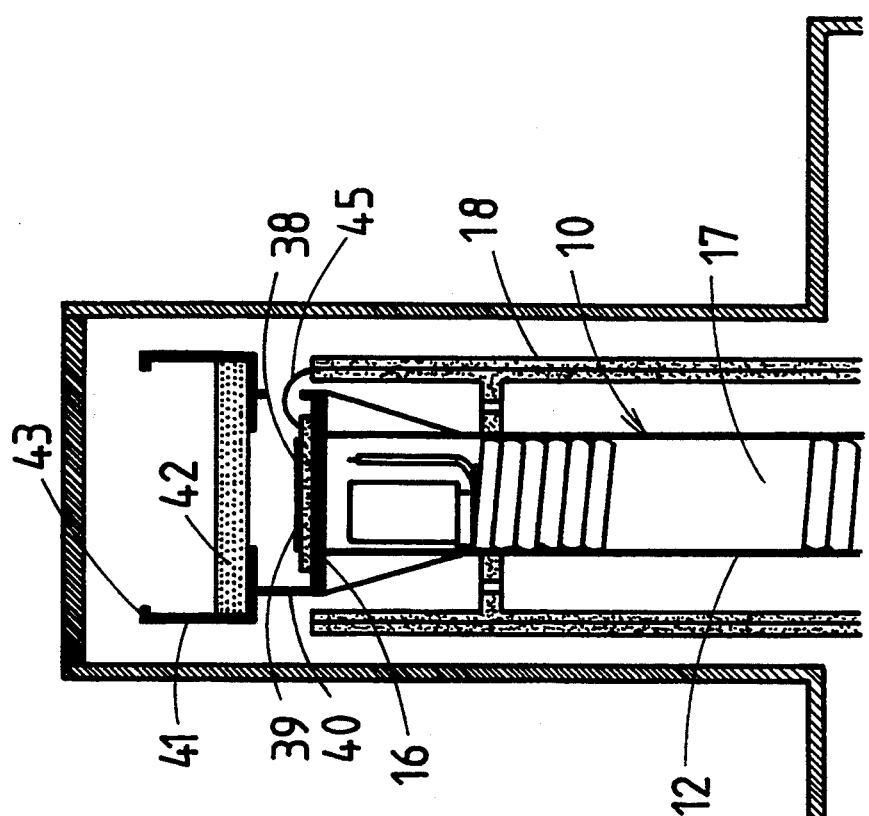
FIG. 2 is a longitudinal sectional view of the sensor assembly of FIG. 1.
Figure 3:
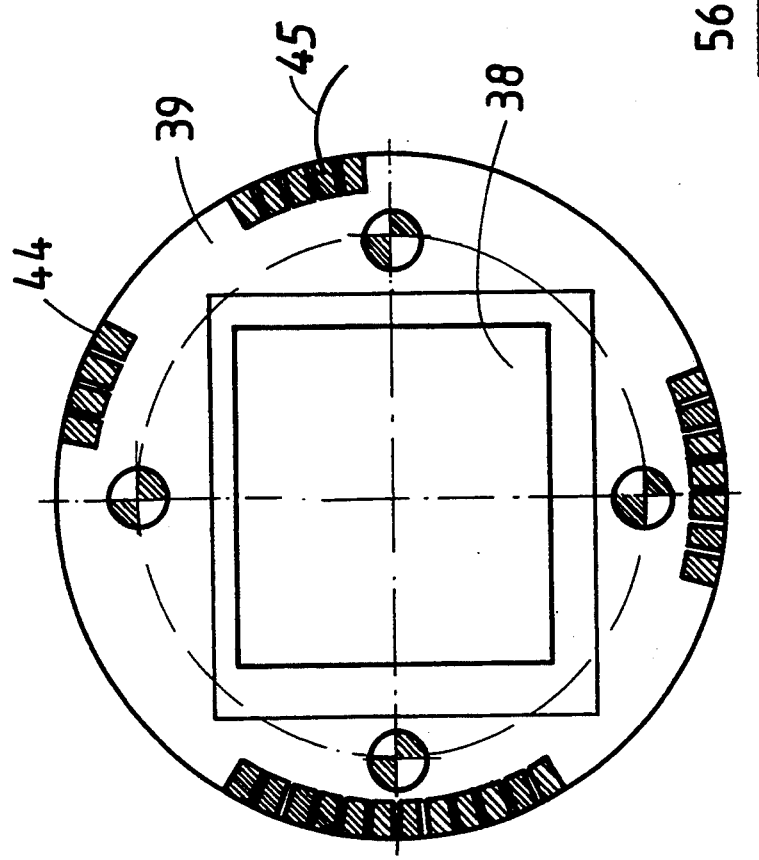
FIG. 3 is a plan view, at an enlarged scale, of the substrate and the sensor of the sensor assembly of FIGS.1 and 2.
Figure 4:
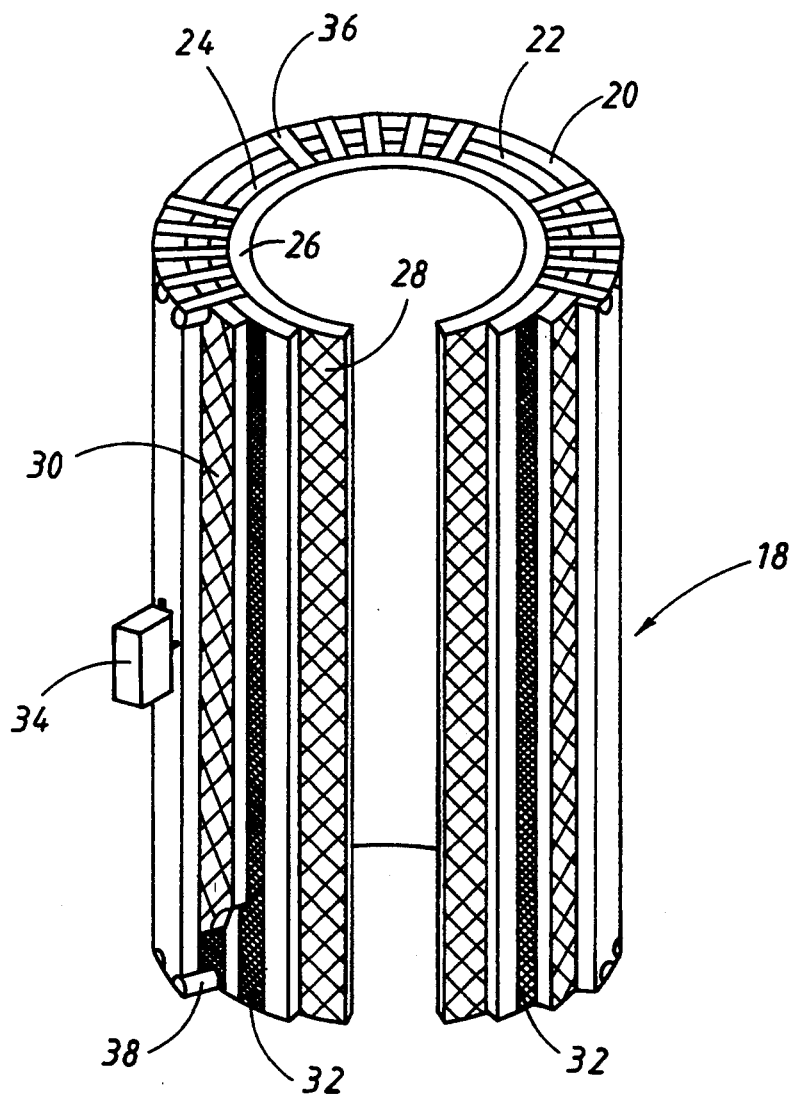
FIG. 4 is a schematic-perspective illustration, partly in section, of a support body in the sensor assembly of FIG. 1.

The tube 12 is surrounded coaxially by a support body 18. The support body 18 is a hollow body made of a multi-layer glass-ceramic material. The multi-layer glass-ceramic material contains an electrically conductive network. This is illustrated in FIG. 4. The support body 18 of FIG. 4 consists of four layers 20, 22, 24 and 26. The innermost layer 26 is provided wit an electromagnetic shield 28 on its outer surface. Similarly, the outermost but one layer 22 is provided with an electromagnetic shield 30 on its outer surface. The intermediate layer 24 is provided with longitudinal strip conductors 32. These strip conductors 32 represent the signal lines. Of course, more than the four layers shielded from each other, as illustrated in FIG. 2, can be provided. Electronic components and circuit elements 34 are mounted on the peripheral surface of the support body 18. These electronic components provide pre-processing of the signals of the sensors and reduction of the lines to be guided out of the vacuum chamber.

The electronic components are connected by through-connection with the line network applied to the various layers. The connection between the components mounted on the inner housing element 10, in particular of the sensor, and the conductors on the various layers of the support body 18 is effected by means of feed-through elements 36 in the end face of the support body 18. To this end, the contacts formed by the feed-through elements are laid bare to a certain extent by grinding-off of the glass-ceramic material. The contacts formed by the feed-through elements 36 are connected to terminals of a sensor 38.

The sensor 38 is a picture sensor with a two-dimensional array of infrared-sensitive detector elements. Of course, the sensor may also be a one-dimensional array of detector elements. The sensor is provided on a substrate 39. The substrate 39 is mounted on plate 16.

The plate 16 carries a holder 41 through posts 40. The holder 41 accommodates a cold filter 42. Furthermore the holder 41 forms a cold light stop 43. The cold filter 42 and the cold light stop 43 are also cooled by the cooling device 17. Thereby infrared radiation is reduced which is emitted by the cold filter 42 and the cold light stop themselves and also impinges on the sensor 38. The cold light stop 43 shields the sensor 38 against infrared radiation which is emitted by the warm environment.

The substrate 39 carries contacts 44 at its edge. The contacts 44 are connected, through contact wires 45, with the contacts formed by the feed-through elements 36 on the end face of the support body 18. These contacts, in turn, are connected with the various conductors 32.

The tube 12 of the inner housing element 10 consists of thin metal. The tube is supported by the support body 18 through a support ring 46. The support ring 46 is retained in the support body 18 and engages the tube 12 with three radial projections 48 spaced by 120°.

The Dewar vessel has an outer housing element 50, which also consists of metal. The outer housing element has a tubular peripheral portion 52. The peripheral portion 52 forms a holder 54 for an infrared-transparent window (not shown) at its upper end, as viewed in FIG. 1. At its lower end, as viewed in FIG. 1, the peripheral portion 52 is integral with an upper socket element 56 extending radially outwards. The upper socket element has a larger-thickness edge 58. The larger-thickness edge 58 is connected with a lower socket element 62 by bolts 60. The lower socket element 62, in its center, forms the socket which accommodates the tube 12. An annular, disc-shaped printed circuit board 64 of multilayer glass-ceramic material is sealingly held between the upper socket element 56 and the lower socket element 62. A vacuum chamber 66 is defined by the outer housing element 50 (with the upper socket element 56,the peripheral portion 52, the holder 54 and the window), the printed circuit board 64 and the inner housing element 10 (with the socket 14, the tube 12 and the plate 16). This vacuum chamber 66 is evacuated. The support body 18 is located within this vacuum chamber.

Figure 5:
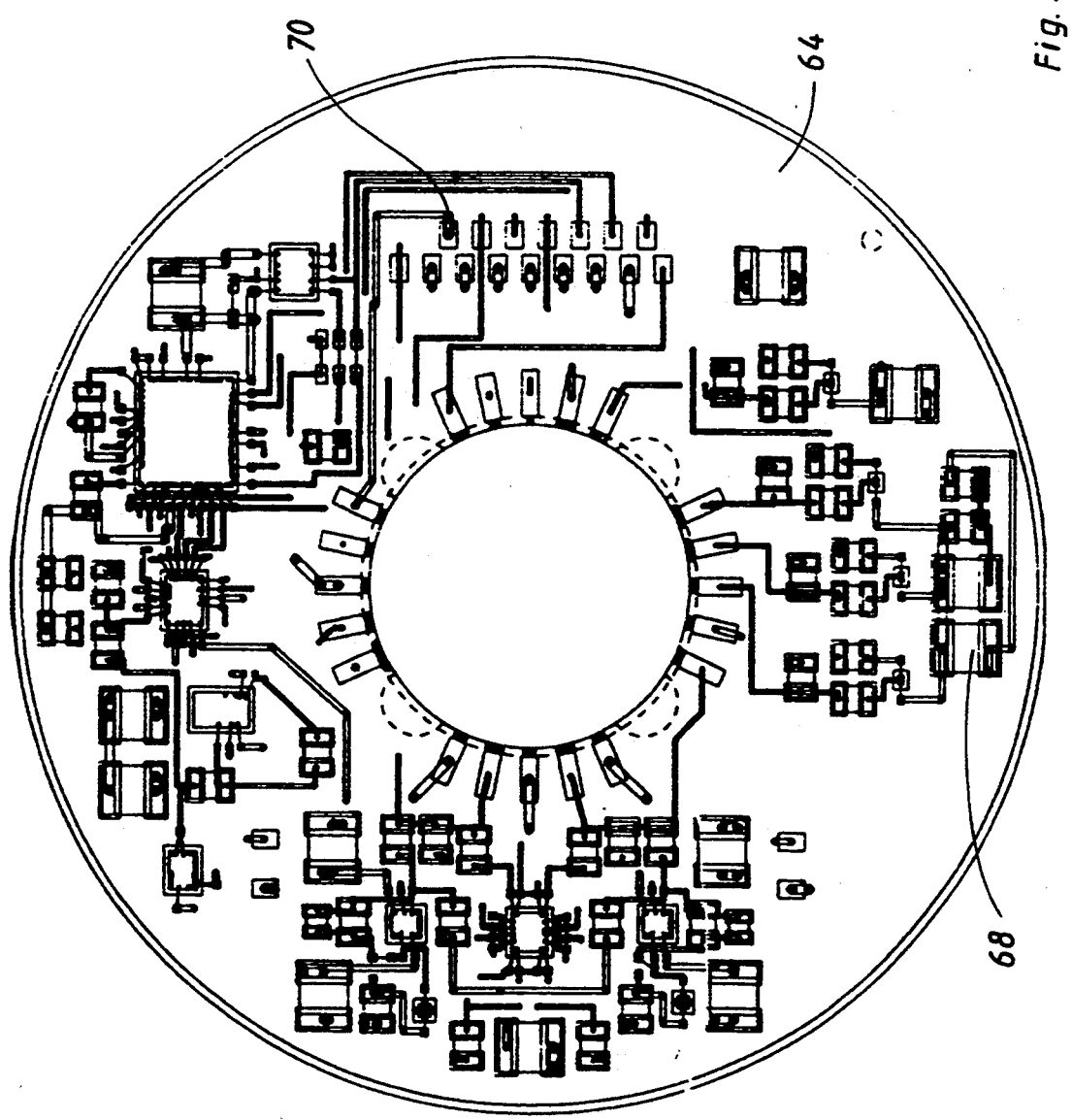
FIG. 5 is a plan view of a printed circuit board in the socket of the sensor assembly of FIG. 1.
Figure 6:
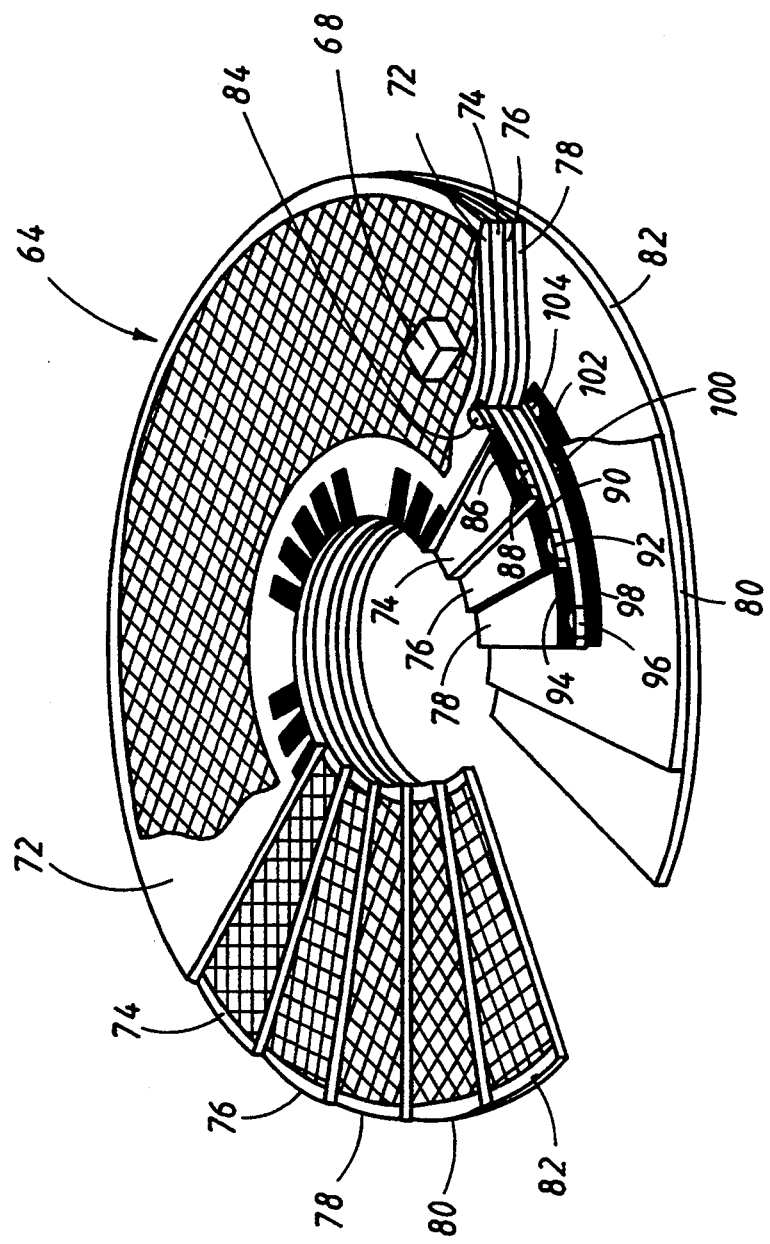
FIG. 6 is a schematic-perspective illustration of the printed circuit board of FIG. 3.

The printed circuit board 64 carries components of sensor-near electronic circuitry, as illustrated in FIG. 5. In addition, the printed circuit board 68 made of multilayer glass-ceramic material contains integrated feed-through structures for guiding electric lines out of the vacuum in the vacuum chamber 66. As can be seen from FIG. 6, the printed circuit board 64 consists of a plurality of layers 72, 74, 76, 78, 80 and 82. A component mounted on the uppermost layer is connected to a strip conductor 86 of layer 74 through a feed-through element 84. The strip conductor 86 extends circumferentially along the layer 74 through a certain distance. The strip conductor 86 is connected to a strip conductor 90 of layer 76 through a feed-through element 88. The strip conductor 90 also extends circumferentially along the layer 76 through a certain distance. The strip conductor 90 is then connected to a strip conductor 94 of layer 78 through a feed-through element 92. The strip conductor 94 extends circumferentially along the layer 78 through a further distance. Then, the strip conductor 94 is connected to a strip conductor 98 of layer 80 through a feed-through element 96. The strip conductor 98 then extends circumferentially through a certain distance along the layer 80 and below the strip conductors 90 and 94. Then the strip conductor 98 is connected to a strip conductor 102 through a feed-through element 100. Also the strip conductor 102 extends circumferentially along the layer 82 through a certain distance below the strip conductor 86. Eventually, a connection is established, by means of a feed-through element, to the underside of the layer 82 located outside the vacuum and thus to the underside of the printed circuit board 64. In this way, a gas-tight electrical feed-through out of the vacuum chamber is achieved.

The sensor-near electronic circuitry located in the vacuum chamber 66 on the support body 18 or the printed circuit board 64 reduces, by signal processing, the number of the lines to be guided out of the vacuum chamber 66. Also this measure reduces the leakage rate. The reduced leakage rate in combination with the relatively large volume of the vacuum chamber results in extension of the useful life of the sensor assembly.

By making both the outer housing element 50 and the inner housing element substantially of metal, the sensor 38 will not be adversely affected by outside interferences.

We claim:

1. A sensor assembly with cooled sensor, comprising:
   a Dewar vessel having an inner housing element (10) and an outer housing element (50), each of said housing elements (10,50) being substantially pot-shaped with bottom portions and peripheral portions, said outer housing element extending around said inner housing element (10), said housing elements being supported on socket means, the two housing elements together with said socket means defining a substantially evacuated vacuum chamber, said inner housing element having an outer surface adjacent said vacuum chamber and an inner surface defining a cavity, which is arranged to receive a cooler,
   a sensor (38) supported within said vacuum chamber on said bottom portion of said inner housing element on said outer surface thereof,
   a tubular support body (18) arranged in said vacuum chamber (66) and surrounding said inner housing element (10), and supported by said socket means,
   said support body (18) carrying radial support means (46,48) for radially supporting said inner housing element (10),
   said support body (18) comprising a plurality of coaxial tubular layers (20,22,24,26) having peripheral surfaces,
   conductors leading to said sensor (40) and arranged on peripheral surfaces of said layers (20,22,24,26) of said support body (18).

2. A sensor assembly as claimed in claim 1, wherein said peripheral portions of said inner and outer housing elements (10,50) consist of metal.

3. A sensor assembly as claimed in claim 1, wherein said support body (18) consists of ceramic material.

4. A sensor assembly as claimed in claim 3, wherein said ceramic material is a multi-layer glass-ceramic material.

5. A sensor assembly as claimed in claim 1, and further comprising signal processing electronic means for processing signals from said sensor (38), components (34) of said signal processing electronic means being mounted on said support body (18) within said vacuum chamber (66).

6. A sensor assembly as claimed in claim 5, and further comprising vacuum tight connecting means for connecting conductors on said support body to terminals outside said vacuum chamber, said signal processing electronic means comprising means inside said vacuum chamber for reducing the number of conductors to be connected to said outside terminals.

7. A sensor assembly as claimed in claim 1, and further comprising a vacuum tight connecting means for connecting conductors on said support body to terminals outside said vacuum chamber, and (b) signal processing electronic means comprising means inside said vacuum chamber for reducing the number of conductors to be connected to said outside terminals.

8. A sensor assembly as claimed in claim 1, and further comprising
   vacuum tight connecting means for connecting conductors on said support body to terminals outside said vacuum chamber, wherein
   said socket means comprise a flange-like first socket element (56) provided on the edge of said pot-shaped outer housing element (50), a second socket element (62) provided at the edge of said pot-shaped inner housing element (10), and an annular disc-shaped printed circuit board (64), which is sealingly held between said first and second socket elements (56,62), said printed circuit board limiting said vacuum chamber, and
   said printed circuit board (64) is a multi-layer printed circuit board having a plurality of layers, said connecting means comprising a number of strip conductors (86,90,94,98,102) on different ones of said layers of said printed circuit board, said strip conductors being interconnected by feed-through means (84,88,92,96,100,104)

9. A sensor assembly as claimed in claim 8, wherein said printed circuit board (64), inside said vacuum chamber, carries electronic components (68) forming part of signal processing electronic means for processing signals from said sensor.

10. A sensor assembly as claimed in claim 1, wherein part of said peripheral surfaces on said layers of said support body carry electric shielding means (28,30).

* * * * *